(12) United States Patent
Speckbacher et al.

(10) Patent No.: US 6,486,467 B1
(45) Date of Patent: Nov. 26, 2002

(54) OPTICAL DETECTOR FOR MEASURING RELATIVE DISPLACEMENT OF AN OBJECT ON WHICH A GRATED SCALE IS FORMED

(75) Inventors: Peter Speckbacher, Kirchweidach; Dieter Michel, Traunstein, both of (DE)

(73) Assignee: Dr. Johannes Heiden Hain GmbH, Traunreut (DE)

(*) Notice: Subject to any disclaimer, the term of this patent is extended or adjusted under 35 U.S.C. 154(b) by 0 days.

(21) Appl. No.: 09/468,186

(22) Filed: Dec. 21, 1999

(30) Foreign Application Priority Data

Dec. 23, 1998 (DE) .......................... 198 59 669

(51) Int. Cl.⁷ .................................................. H01J 3/14
(52) U.S. Cl. .............................. 250/237 G; 250/231.16
(58) Field of Search ........................ 250/231.13, 231.14, 250/231.16, 208.2, 237 R, 237 G; 341/13, 11, 31

(56) References Cited

U.S. PATENT DOCUMENTS

| 5,204,524 A | * | 4/1993 | Ichikawa | 250/237 G |
| 5,283,434 A | * | 2/1994 | Ishizuka | 250/237 G |
| 5,666,196 A | | 9/1997 | Ishii et al. | |
| 5,670,781 A | | 9/1997 | Setbacken | |

FOREIGN PATENT DOCUMENTS

| DE | 25 11 350 | 10/1975 |
| DE | 40 91 517 | 8/1991 |
| DE | 40 06 789 | 9/1991 |
| DE | 195 24 725 | 7/1996 |
| DE | 196 18 593 | 11/1996 |
| DE | 197 01 941 | 7/1997 |
| DE | 197 20 300 | 12/1997 |
| EP | 0 543 513 | 10/1992 |
| EP | 0 720 005 | 12/1995 |
| GB | 1 504 691 | 3/1974 |

* cited by examiner

Primary Examiner—Stephone Allen
Assistant Examiner—Bradford Hill

(57) ABSTRACT

Electronic components of an optoelectronic sensor for a measuring system are arranged on the side of a semiconductor substrate that is facing away from a scale. The semiconductor substrate between electronic components and the scale is removed at those locations where the components emit or detect an electromagnetic beam. In this way, it is possible to arrange all of the electrical connections of the components and further electronic assemblies of the measuring system on a first side of the semiconductor substrate, and all optical components of the measuring system on a second side of the semiconductor substrate.

28 Claims, 1 Drawing Sheet

OPTICAL DETECTOR FOR MEASURING RELATIVE DISPLACEMENT OF AN OBJECT ON WHICH A GRATED SCALE IS FORMED

The present invention relates to an integrated optoelectronic sensor of a measuring system for scanning a scale with graduation markings, and to a method for manufacturing such sensor.

DESCRIPTION OF RELATED ART

British Patent 1,504,691 and a corresponding German Patent Application 25 11 350 A1 describe a measuring system in which the movement of a first assembly relative to a second assembly is detected. For this purpose, there are two gratings, which are at a constant distance from each other, each being attached to one assembly, When the second grating is illuminated by the divergent light of a light source, the first grating generates a periodic image of the second grating. The image is not stationary if there is a relative motion between the two assemblies.

Photo detectors are also included, which have a periodic pattern and are fixedly joined to the second assembly. The first grating is a reflecting grating, and the second grating as well as the photo detectors are essentially in the same plane. The light source and the second grating can also be replaced by a pattern-generating light source, which generates the same image as would a conventional light source and a grating. The pattern of the photo detectors interacts with the image such that a periodic change of the output signal of the photo detectors occurs if there is a relative movement between the first and second assemblies.

One are disadvantage of this system is that the two assemblies are formed individually, separately from one another. As a result, a relatively large space is required to assemble the entire arrangement.

German Patent Application 197 01 941 A1, describes arranging a scanning grating on the side of a light-transmissive carrier that is facing a scale. The scanning grating is illuminated by a light source such that an image of the grating is projected onto the scale. A second grating is located on the scale, which reflects the image onto a pattern-generating photo detector. The light-transmissive carrier for the first grating is connected to the semiconductor material in which the pattern-generating photo detector is formed, so that the scanning grating and the photo detector are shifted exclusively in the measuring direction with respect to each other. The scanning grating and photo detector are at the same distance from the scale. German Patent Application 197 01 941 A1 also describes a scanning grating arranged on the side of the light-transmissive carrier that is facing away from the scale. An optical chip is arranged on the same light-transmissive carrier that contains the photo detector, on the same side as the scanning grating. This arrangement makes it possible to place the scanning grating and the pattern-generating photo detector at approximately the same distance from the scale.

The described system has the disadvantage that the light-transmissive carrier, on which the scanning grating is applied, must be joined to the semiconductor material in which the pattern-generating photo detector is formed. This connection must be carried out very precisely so that the pattern of the photo detector is aligned parallel to the grating, and the pattern and the grating have the same distance from the scale, This exact connection between carrier and semiconductor material is therefore very difficult to form.

The system also has the disadvantage that an optical chip has to be secured on the light-transmissive carrier. By securing the chip using chip-on-glass technology, it is inevitable that a distance will exist between the optical chip and the carrier. Because of this arrangement, the distances between the scanning grating and the scale, and between the photo detector and the scale significantly deviate from each other, which leads to a significant degradation of the optical properties of the arrangement.

German Patent 40 91 517 T1, describes a sensor for a measuring system made from a single block of semiconductor material. On the surface of a planar-configured light-emitting diode, there are photo elements configured as grating lines, through which the light-emitting diode can shine. In this way, a pattern-generating photo detector is formed, above or below which a pattern-generating light source is arranged.

One disadvantage of this sensor is that the photo detector pattern and the pattern-generating light source cannot have the same distance from a scale, since the light-emitting diode and the photo detector are disposed on top of each other. This varying distance to the scale in turn impairs the optical properties of the sensor.

European Patent Application 543 513 A1, describes a common semiconductor substrate made of III/V semiconductor material, such as gallium arsenide GaAs, having both a pattern-generating photo detector as well as a pattern-generating light source. Both of these components can be formed by a light-emitting diode and a sensor. By forming the pattern-generating light source and the pattern-generating photo detector on a common semiconductor material, the transmitting and receiving structuring can easily be placed as closely as possible in the same plane. Furthermore, a single-field scanning takes place in which the photo elements are shifted by [90°+(k*360)] degrees, with k being an integer. Therefore, a plurality of photo elements can be arranged so as to be shifted with respect to each other, in the measuring direction, by ninety degrees of angle plus whole-number multiples of three hundred sixty degrees of angle. In this ways the scanning becomes particularly insensitive to disturbances.

A disadvantage of this design is that there is no description how the pattern-generating photo detector and the pattern-generating light source can be manufactured on a common semiconductor material made of GaAs. If known technologies of semiconductor manufacturing from the related art are applied, this manufacturing process is very cumbersome and therefore expensive.

European Patent Application 720 005 A2 describes an optical sensor for a measuring system, which has a light-emitting component, a light-receiving component, and at least one optical component, which influences the beam of light emitted by the light-emitting component before the beam of light reaches the light-receiving component. This sensor has a distancing element, which defines a distance between the light-emitting or the light-receiving component and the optical component. According to the design, the optical sensor emits and receives optical signals on its side, so that all optical assemblies are arranged on the same side, and the leads for electrical signals are on the opposite side of the sensor.

One disadvantage of this system is that the light-receiving component, the light-emitting component, the at least one optical component, and the distancing element are all made as separate components, which must be manufactured and assembled separately. In view of the required tolerances for optical sensors of measuring systems, this process is very expensive. Furthermore, the optical sensor is relatively bulky, because the individual components must also be manipulated separately.

German Patent Application 197 20 300 A1 describes an electronic hybrid structural component with a chip-on-chip arrangement, where an implanted chip is arranged on a carrier substrate. For this purpose, the carrier substrate has at least one cavity in which is located an electrical insulating layer having a metallic layer on top of it. The chip implanted in the cavity contacts the metallic layer, as a result of which the latter is used as an electrical lead. If the implanted chip is a light-emitting diode, the metallization layer can also be used to reflect its beam on the walls of the cavity.

This arrangement has the disadvantage that both the illuminating direction of the light-emitting diode as well as its electrical contacts are arranged on one side of the semiconductor substrate, and light is only emitted on this one side.

German Patent Application 196 18 593 A1 describes a photo-sensitive detector element having an active region, the active region being configured between two adjoining layer areas of a layered arrangement, having differing charge carriers and within which an incident electromagnetic beam is converted into electrical signals. The position of the active region relative to the two adjoining surfaces is selected, taking into account the penetration depth of the beam, such that at least two contact elements can be mounted. The two contact elements form a connection of the detector element with an evaluation circuit on a surface which is situated opposite the photo-sensitive surface onto which the incident beam arrives.

In the manufacturing process of a detector element of this type, the following process steps are employed. A semiconductor substrate is doped to a defined extent, and an etching stop layer is generated immediately beneath a limiting first surface. A spatially selective etching away of the substrate present beneath the etching stop layer then takes place, until the etching stop layer forms a limiting second surface. Subsequently, a spatially limited layer area above the etching stop layer, having a different doping than the semiconductor substrate, is generated. The detector element contacts at least two contact elements on a side that is opposite the second surface. However, this document only discloses a photo diode, but no complete optoelectronic sensor is described.

SUMMARY OF THE INVENTION

There is thus a need for an integrated optoelectronic sensor and a method to manufacture it, in which the components of the sensor are formed in an integrated manner on a semiconductor substrate. Preferably, all of the electrical contacts are placed on one side of the semiconductor substrate, and all of the optical signals are emitted and received on the other side. The manufacturing process for this integrated optoelectronic sensor is also more cost-effective than current processes.

The system according to the present invention has a light source, photo elements, and an intensifier as well as an interpolation unit that can be integrated on one semiconductor substrate. All electrical contacts of the components of the sensor are arranged on the side of the sensor facing away from the scale, while the optical signals are emitted and received on the side of the sensor facing the scale. The small size of the assembly and the high degree of integration lead to reduced manufacturing costs. the optoelectronic chip having photo elements, light source, and evaluation electronics can be joined to the carrier for the scanning grating in a simple manner.

SUMMARY OF THE DRAWINGS

Details of the invention are discussed at greater length in the following text, with reference to the specific embodiment shown in the drawing.

The drawing of FIG. 1 shows a cross-section of the sensor according to the invention, including a scale.

DETAILED DESCRIPTION OF THE PREFERRED EMBODIMENTS OF THE INVENTION

Figure 1:
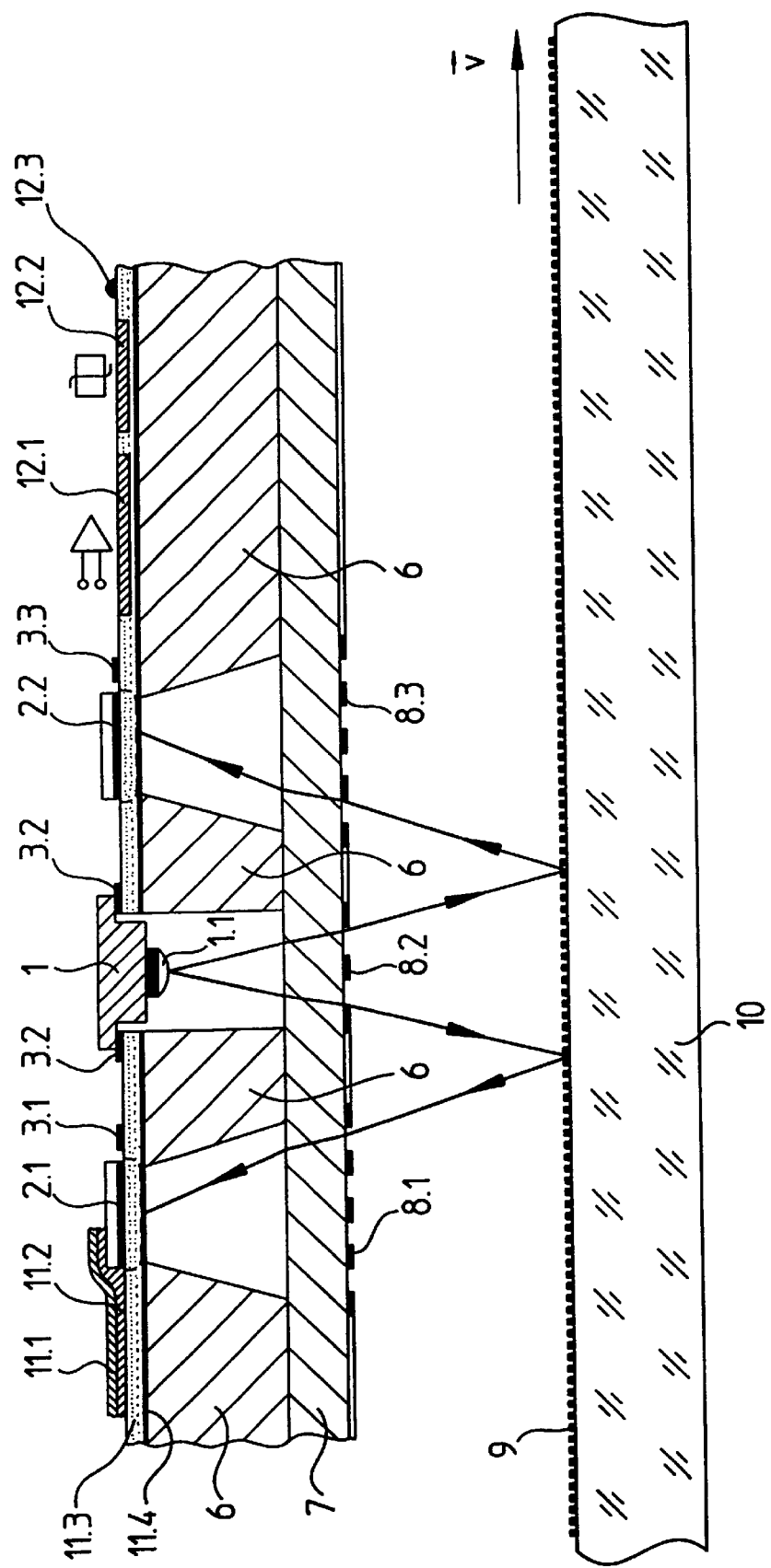

The sensor according to the invention is described below with reference to an exemplary embodiment that contains a length-measuring system. However, it is possible to use the sensor according to the invention in an angle-measuring system, or in a two-dimensional measuring system, without significant modifications.

In the drawing, the optoelectronic sensor of the invention is depicted schematically. On the side of semiconductor substrate 6 facing away from scale 10, photo-diodes 2.1 and 2.2 are arranged underneath passivizing layers 11.1, 11.2, which can be made of silicon oxide and/or silicon nitrite. The manner of manufacturing the photo-diodes is described in German Patent Application 196 18 593 A1, and will not be repeated. Photo diodes 2.1 and 2.2 are produced directly on semiconductor substrate 6, which forms the sensor according to the invention. Two photo diodes 2.1 and 2.2 represent at least one functional assembly, which can contain a plurality of photo diodes or a plurality of groups of photo diodes connected with each other, for example for use in single-field scanning.

The functional assemblies of photo diodes 2.1 and 2.2 can be arranged symmetrically with respect to a beam source 1 of an electromagnetic beam, in particular light. The beam is generated preferably by a light-emitting diode 1. Light-emitting diode 1 is a separate component, but can be joined to semiconductor substrate 6 as is depicted in the drawing.

Alternatively, using appropriate doping, a light-emitting diode 1 can also be produced from semiconductor substrate 6 from which photo diodes 2.1 and 2.2 are formed. However, since the latter alternative is difficult to construct, a separate SMD component is preferred, as shown in the drawing.

Semiconductor substrate 6 near diode 1 is completely etched through using an anisotropic etching, to allow the beam of diode 1 to reach the side of substrate 6 opposite from the side on which the diode 1 is mounted. The light-emitting diode can have an optical component, such as a lens 1.1, which collimates the beam in the direction of one side of semiconductor substrate 6.

Additional electrical assemblies can be arranged on the side of semiconductor substrate 6 facing away from scale 10. In addition to electrical leads 3.1 and 3.3 and contact surfaces 3.2 and 12.3, complex semiconductor circuits 12.1 and 12.2 can also be formed on the common semiconductor substrate 6. Accordingly, there is preferably included a low-noise intensifier 12.1 for the output signals of photo diode assemblies 2.1 and 2.2, as well as an interpolation assembly 12.2 for the output signals of low-noise intensifier 12.1.

Semiconductor substrate 6 is disposed on the side facing scale 10 and is joined to a carrier 7 that is transparent to the beam emitted by light-emitting diode 1. This connection can be achieved by a thermal or an anodic bonding. Transparent carrier 7 can have one or a plurality of spacer-type divisions 8.1, 8.2, and 8.3, whose precise pattern is dependent on the measuring system to be assembled. The spacer-type divisions 8.1, 8.2, and 8.3 are preferably applied on the side of carrier 7 that is facing the scale, as is depicted in the drawing. Alternatively, an arrangement of spacer-type divisions 8.1, 8.2, and 8.3 on the other side of carrier 7 can be formed, In that case, it should be ensured that spacer-type divisions 8.1, 8.2, and 8.3 only cover the free surfaces on which there is no semiconductor substrate 6. Otherwise, a connection between semiconductor substrate 6 and carrier 7 will likely be defective.

The optoelectronic sensor constructed according to the invention is arranged opposite a scale 10, which supports a scale graduation marking 9, Light-emitting diode 1 emits through a lens 1.1 a collimated light beam in the direction of scale 10. This light beam is first bent by a spacer-type division 8.2, then arrives at scale graduation marking 9 of scale 10. The beam is bent there, and is bent again at spacer-type divisions 8.1 and 8.3, before it arrives at photo diodes 2.1 and 2.2, where the intensity of the beam of light is measured. The output signal of photo diode 1 is fed to at least one intensifier 12.1, whose output signal is fed to at least one interpolator 12.2. All of these elements can be formed on the semiconductor substrate.

To execute the electrical wiring in one plane, photo elements 2.1 and 2.2 are formed as diaphragms, as is depicted in the drawing. For this purpose, reference is made in particular to the method in accordance with German Patent Application 196 18 593 A1, incorporated herein by reference in its entirety. The etching process for manufacturing the diaphragm can be executed as a wet or dry etching process. In the wet etching process, the etching angle is prescribed by the crystal orientation (approximately 54° in a 1-0-0 silicon crystal).

In the wet etching process, a defined etching stop for the diaphragm thickness is important The stop is formed by a SIMOX substrate, in which embedded $SiO_2$ acts as the etching stop. In etching using plasma discharge, etching angles up to 90° can be generated, The etching gases used for this process are sulfur hexafluoride ($SF_6$), trifluoromethane ($CF_3$), and oxygen ($O_2$). By alternating the use of the etching gases during the etching process, the etching angle can be adjusted. The etching gas sulfur hexafluoride effects essentially an anisotropic etching process, while trifluoromethane effects an essentially isotropic etching process. Preferred plasma etching agents for this purpose employ an inductive coupled plasma source.

The thickness of the diaphragm can be optimized in accordance with the wave length of the light. For example, this could result in about a 30 μm diaphragm thickness of photo diodes 2.1 and 2.2, at a wave length of 860 nm of the electromagnetic beam emitted by light-emitting diode 1.

To avoid generating charge carriers outside the active diaphragm, for example by scattered light, the end surfaces of the reverse-etched walls of semiconductor substrate 6 can be coated with a metallic reflecting surface. Both perpendicular and non-perpendicular walls can be covered by a metallic reflecting surface by sputtering of metals. In a preferred embodiment, the metals can be aluminum or chromium.

Alternatively, charge carriers generated by scattered light falling outside the active diaphragms of photo diodes 2.1 and 2.2, can be suppressed by the use of a SIMOX substrate known in the related art. The generation of charge carriers then only takes place in the uppermost silicon layer 11.3, which is separated electrically from semiconductor substrate 6 by the SIMOX-oxide. Electron-hole pairs generated in semiconductor substrate 6 thus do not reach photo diodes 2.1 and 2.2, due to oxide layer 11.4.

To achieve an increase in the sensitivity of photo elements 2.1 and 2.2, a reflector can be applied on the surface of the active diaphragm under passivizing layer 11.2. This can be done, for example, with aluminum by using sputtering technology. If the reflector is conductive, it can also be used as an electrical connection to the photo diodes. Using the reflector, beams of light that would otherwise escape are again reflected into the active area of the diaphragm of photo diodes 2.1 and 2.2, therefore increasing the photo-electric current.

The side of the photo element that is facing the entry print of the light, such as the lower side of the diaphragm, can also be made non-reflective through additional layers composed of $SiO_2$ and/or $Si_3N_4$. The layer thickness of this non-reflecting layer can be selected as a function of the wave length of the beam emitted by light-emitting diode 1. In this way, the sensitivity of photo diodes 2.1 and 2.2 can be additionally increased.

The light source can be, for example a light-emitting diode 1 that is integrated and electrically contacted on the same plane as photo diodes 2.1 and 2.2, the intensifier 12.1, and interpolation unit 12.2, as is depicted in the drawing. For this purpose, an opening that passes through the silicon carrier completely is formed by using an etching process. Light-emitting diode 1 is fitted with components from above as an SMD element. Alternatively, a carrier body for light-emitting diode 1 can be provided, in order to vary the height of the emitting plane of light-emitting diode 1.

A housing made of silicon or of gallium arsenide (GaAs) can be used as a carrier body of light-emitting diode 1. In this way it is assured that the carrier body has the same coefficient of expansion as light-emitting diode 1, which is usually formed from GaAs. Using the above-mentioned materials to make the carrier body for light-emitting diode 1 also assures that a good heat sink is produced due to the good heat conductivity of the carrier body. This has positive effects on the service life and performance of light-emitting diode 1. At the same time, the carrier body functions as the electrical contact for the SMD component array on the silicon surface, and as the contact of light-emitting diode 1. In another embodiment, it is possible to apply a lens 1.1 on the radiating surface of light-emitting diode 1, to influence the course of the beam. The rear side of the carrier body of light-emitting diode 1 can be protected by a ceramic shield against heat absorption and emission.

All electrical connections for light-emitting diode 1, photo elements 2.1 and 2.2, the intensifier 12.1 and interpolation unit 12.2 are located on the same plane, thus the electrical connecting lines 3.1, 3.3 to processing assemblies for the output signals of the optoelectronic components can be connected in a simple manner. A further advantage of using the SIMOX substrate is that the electrically active surface is already electrically insulated from semiconductor substrate 6. In addition, silicon layer 11.3, which is grown epitaxially, represents the ideal precondition for integrating the intensifier and the interpolation unit, due to the purity and the crystalline order of the layer.

In one embodiment, the entire surface of the contacting plane can be protected using a passivizing layer 11.1 and 11.2, for example made of $SiO_2$ and $Si_3N_4$, using a CVD process (chemical vapor deposition). The preferred material for the semiconductor substrate is silicon having a crystal orientation (1-0-0), to achieve a preferred angle of 54° in the wet etching process. In addition, silicon having this orientation is also preferable for a CMOS integration for intensifier 12.1 and interpolation unit 12.2.

Carrier 7, which is applied to the lower side of semiconductor substrate 6, supports grating structures 8.1, 8.2 and 8.3 that are necessary for the optical effect, as is depicted in the drawing. Grating structures 8.1, 8.2, and 8.3 can be formed as phase gratings and/or as amplitude gratings, which can be, for example, chrome gratings. Grating structures 8.1, 8.2, and 8.3 can be applied on the side facing away from semiconductor substrate 6. It is also possible to apply grating structures 8.1, 8.2, and 8.3 to the side of carrier 7 that is facing semiconductor substrate 6. It is important that grating structures 8.1, 8.2, and 8.3 be introduced only locally into the opening beneath photo elements 2.1 and 2.2, as well as beneath light-emitting diode 1. This configuration results in a bond of semiconductor substrate 6 to the glass that is not impaired by scanning grating 8.1, 8.2, and 8.3.

In an alternative configuration, carrier 7 includes at least one grating formed on the side facing away from scale 10, as well as at least one grating formed on the side facing scale 10. These at least two gratings that are applied on both sides of carrier 7 can be formed as phase gratings, as amplitude gratings, or as a combination of phase and amplitude gratings. The structuring of the phase gratings can be arranged not only parallel to the grating lines of scale graduation marking 9 on scale 10, but also can be selected to be perpendicular, Using an azimuth arrangement of this type, several regions on scale graduation marking 9 can be scanned at the same time, as a result of which the sensitivity to contamination is reduced.

In a further alternative embodiment, an optical lens is introduced into carrier 7 beneath the beam plane of light-emitting diode 1. Due to the silicon opening, the lens can be applied on both sides of carrier 7, at the same time facing scale 10 and facing away from it. A lens of this type can be obtained using electron lithography in a PMMA resist. The curvature of the lens in the resist can be brought about as a result of the varying exposure doses in the resist. The resist structure is then transferred via plasma etching to carrier 7. Using this technique, it is also possible to include in the lens itself a further structure, such as a phase grating 8.2.

The invention allows creating a simple bonding of semiconductor substrate 6 to optically effective pattern-generating carrier. As a result of the rear side etching of semiconductor substrate 6 in the active areas of photo elements 2.1, 2.2 all the electrically active areas can be applied to the surface of semiconductor substrate 6. Two polished planar surfaces, for example made of silicon and glass, of semiconductor substrate 6 and carrier 7 can be joined to each other at their boundary layer. For this purpose, methods utilizing thermal bonding or anodic bonding can be used.

A furthered advantage of joining carrier 7 to semiconductor substrate 6, without interposing a distance between the two, is that no potential scattered light can expand through reflection in a channel between semiconductor substrate 6 and carrier 7. Carrier 7 can also function as protection during separation of the sensors, when the sensor is produced in a multiple printed panel on the plane of the wafer. In the same way, the etched-clean area can be protected from contaminants.

Carrier 7 can be provided on the side facing the scale with a non-reflective layer that is adjusted to the appropriate wavelength. Carrier 7 can be composed, for example, of the material Pyrex, which has the same length expansion coefficient as silicon. This selection of materials reduces stresses, increases the mechanical stability of the silicon, and thus avoids formation of dislocation lines in the silicon, which can lead to electrical fault points.

The measuring system in which the sensor according to the invention is used can be both a uni-dimensional measuring system, such as a length and angle measuring systems, as well as a two-dimensional measuring system, such as a cross-grating measuring system having as a scale a cross-line or checkerboard grating. The scanning system required for this latter application can include two sensors according to the invention that are preferably orthogonal with respect to each other. Alternatively, one sensor can integrate the two groups of photo elements having uni-dimensional structuring, so that the orientation of the photo elements corresponds to the measuring directions. The photo elements can also be positioned to be orthogonal with respect to each other. The emitting grating is then configured as a two-dimensional grating, for example a cross-line or a checkerboard grating, and can be made as a single grating.

To achieve a more compact design of the entire sensor according to the invention, additional electronic circuits 12.1 and 12.2 can be integrated in a separate semiconductor substrate, which is spatially arranged above semiconductor substrate 6 having the optoelectronic assemblies. Since the electrical contacts according to the invention are already arranged exclusively on the upper side of the semiconductor substrate, it is easy to provide a contact to the semiconductor substrate, using chip-on-chip technology. In this way, the length of the connecting lines between the optoelectronic and the electronic assemblies can be significantly shortened, which leads to greater immunity to manufacturing discrepancies, and makes possible a more rapid signal processing due to a higher pulse rate.

The features of the sensor according to the invention that have been described above with reference to various exemplary embodiments could be combined with each other in many ways, while remaining within the scope of the invention.

A method for manufacturing the sensor according to the invention includes, as a first step, applying on semiconductor substrate 6 a first oxide layer $SiO_2$ 11.4, in accordance with a SIMOX procedure. The process steps that are used in this context are well-known from the related art regarding manufacturing methods in semiconductor technology. Subsequently, a silicon layer 11.3 is grown epitaxially to the desired thickness on the side of semiconductor 6 that is facing away from scale 10.

In a second step, photo diodes 2.1 and 2.2 are formed by a corresponding doping of the areas in which the photo detectors are to be arranged, In this step, the further assemblies such as intensifier 12.1 and interpolator 12.2 can be produced, if provision is made for them on the same semiconductor substrate 6.

In a third step, printed circuit traces 3.1 and contacts 3.2, 12.3, as well as the metallic coatings of the rear sides of photo diodes 2.1, are applied. This can take place by applying a metallization layer of aluminum-titanium oxide, which is formed according to known photochemical processes.

In the next step, the diaphragms of photo diodes 2.1 and 2.2 are etched, and the openings are etched through using wet or plasma etching processes. For wet etching, for example, KOH is used, and silicon oxide layer 11.4 situated beneath the surface is used as an etching stop. Plasma etching can take place using etching gases $CHF_3$ and $SF_6$. As the etching stop, silicon oxide layer 11.4 can also be used here. To monitor the etching process, the components contained in the etching gas are monitored in the light of the plasma discharge, similarly to the process used in gas chromatography.

In the next step, carrier 7 is prepared to be added to the structure of semiconductor substrate 6. The desired phase- and/or amplitude spacer-type divisions 8.1, 8.2, and 8.3 can also be applied to carrier 7 in this step.

It is also possible to integrate the lens used for collimating the light of light-emitting diode 1 into carrier 7. For this purpose, a model for the lens is formed in a PMMA resist using electron beam lithography. The dose used during the irradiation using electrons is modified in the process, such that after the developing process the shape of an optical lens is obtained. This lens mold is transferred, for example using plasma etching processes, into the material of carrier 7. In this manner, grating structures 8.1, 8.2, and 8.3 provided on carrier 7 can also be generated. Carrier 7 is then joined to semiconductor substrate 6 using bonding technologies, for example, anodic or thermal bonding.

In the next step, light-emitting diode 1 is connected to contact points 3.2 in an electrically conductive manner, while being placed in a housing made of semiconductor material and having a ceramic shield.

When further assemblies such as intensifier 12.1 and interpolator 12.2 are not formed next to optoelectronic assemblies 1, 2.1 and 2.2, it is possible to subsequently join an additional semiconductor substrate, in which the additional assemblies are formed, to semiconductor substrate 6 from above. This bonding can be carried out using chip-on-chip technology, so that the two semiconductor substrates are joined to each other in an electrically conductive manner.

What is claimed is:

1. An integrated optoelectronic sensor for scanning a scale that has a scale graduation marking, comprising:
   a semiconductor substrate having a first face facing away from the scale;
   a plurality of photo detectors disposed adjacent to the semiconductor substrate;
   first portions of the semiconductor substrate defining openings extending through the semiconductor substrate adjacent to the photo detectors;
   a light source disposed on the first face;
   second portions defining openings through the semiconductor substrate, said second portions being disposed adjacent the light source; and
   a carrier body having at least one grating structure, the carrier body being disposed on a second face of the semiconductor substrate facing the scale.

2. The sensor as recited in claim 1, further comprising:
   a blocking layer disposed on the first face of the semiconductor substrate; and
   a semiconductor layer disposed on the blocking layer, opposite the semiconductor substrate, wherein the second portions define openings also through the semiconductor layer and the blocking layer.

3. The sensor as recited in claim 2, wherein the photo detectors are formed in the semiconductor layer which is insulated from the semiconductor substrate by the blocking layer.

4. The sensor as recited in claim 1, wherein the light source is symmetrical with respect to the photo detectors.

5. The sensor as recited in claim 2, wherein the semiconductor substrate is formed of silicon, the blocking layer is formed of silicon oxide $SiO_2$, and the semiconductor layer is formed of silicon applied epitaxially.

6. The sensor as recited in claim 1, wherein the light source is divergent.

7. The sensor as recited in claim 1, wherein the light source is a light-emitting diode having a lens.

8. The sensor as recited in claim 7, wherein the lens is integrated in the carrier.

9. The sensor as recited in claim 7, wherein the light-emitting diode is connected to electrical contact surfaces arranged on the first face of the semiconductor substrate and emits light towards the scale.

10. The sensor as recited in claim 7, further comprising a second semiconductor substrate joined to the first face of the semiconductor substrate, wherein the light-emitting diode is connected to electrical contact surfaces of the second semiconductor substrate, and emits light towards the scale.

11. The sensor as recited in claim 7, wherein the light-emitting diode is disposed in a housing having a temperature expansion coefficient substantially equal to that of the light-emitting diode.

12. The sensor as recited in claim 11, wherein the housing of the light-emitting diode is composed of one of silicon and gallium arsenide.

13. The sensor as recited in claim 11, wherein the housing of the light-emitting diode further comprises a ceramic carrier body.

14. The sensor as recited in claim 2, further comprising a passivizing layer made of at least one of silicon oxide and silicon nitrite, the passivizing layer being disposed adjacent the first face of the semiconductor substrate.

15. The sensor as recited in claim 2, further comprising at least one electronic circuit formed in the first face of the semiconductor layer.

16. The sensor as recited in claim 2, further comprising a reflecting layer for reflecting a beam of the light source, said reflecting layer being disposed on a side of the photo detectors facing the scale.

17. The sensor as recited in claim 16, wherein border surfaces of the semiconductor substrate comprise a coating disposed adjacent to the photo detectors, the coating reflecting the light emitted from the light source.

18. The sensor as recited in claim 2, wherein a portion of the blocking layer adjacent to the photo detectors, where light from the light source impinges, is non-reflective.

19. The sensor as recited in claim 2, wherein the carrier body has a temperature expansion coefficient substantially equal to that of the semiconductor substrate.

20. The sensor as recited in claim 19, wherein the carrier body is composed of Pyrex.

21. The sensor as recited in claim 2, further comprising electrical leads and contacts disposed on at least one of the first face of the semiconductor substrate, the blocking layer, and the semiconductor layer.

22. The sensor as recited in claim 2, further comprising at least one lens integrated into the carrier body.

23. The sensor as recited in claim 2, wherein the carrier body comprises a grating structure lying on a plane parallel to a plane of the scale.

24. The sensor as recited in claim 23, wherein the grating structure is one of an amplitude grating and a phase grating.

25. A measuring system comprising:
   a scale;
   scale graduation markings disposed on the scale;
   an integrated optoelectronic sensor for scanning the scale, said integrated optoelectronic sensor further comprising:

a semiconductor substrate having a first face facing away from the scale;

a blocking layer disposed on the first face of the semiconductor substrate;

a semiconductor layer disposed on the blocking layer, opposite the semiconductor substrate;

a plurality of photo detectors disposed on the semiconductor layer;

first portions of the semiconductor substrate defining openings extending through the semiconductor substrate adjacent to the photo detectors;

a light source disposed on the first face;

second portions defining openings through the semiconductor layer, the blocking layer, and the semiconductor substrate, said second portions being disposed adjacent the light source; and a carrier body having at least one grating structure, the carrier body being disposed on a second face of the semiconductor substrate facing the scale.

26. An integrated optoelectronic sensor for scanning a scale that includes a scale graduation marking, comprising:

a semiconductor substrate having a first face facing away from the scale;

a plurality of photo detectors disposed adjacent to the semiconductor substrate;

first portions of the semiconductor substrate defining openings extending through the semiconductor substrate adjacent to the photo detectors;

a light source disposed on the first face;

second portions defining openings through the semiconductor substrate, said second portions disposed adjacent the light source;

a carrier body having at least one grating structure, the carrier body disposed on a second face of the semiconductor substrate facing the scale;

a blocking layer disposed on the first face of the semiconductor substrate; and a semiconductor layer disposed on the blocking layer, opposite the semiconductor substrate;

wherein the second portions define openings also through the semiconductor layer and the blocking layer.

27. The sensor as recited in claim 26, wherein the blocking layer is configured as an etch stop and to block electron-hole pairs from the semiconductor substrate.

28. The sensor as recited in claim 26, wherein the semiconductor layer is configured to allow formation of at least one of a photo diode, an intensifier, and an interpolation unit.

* * * * *